United States Patent
Xu et al.

(10) Patent No.: US 10,818,325 B2
(45) Date of Patent: Oct. 27, 2020

(54) DATA PROCESSING METHOD AND DATA PROCESSING SYSTEM FOR SCALABLE MULTI-PORT MEMORY

(71) Applicant: CENTEC NETWORKS (SU ZHOU) CO., LTD., Suzhou (CN)

(72) Inventors: Jun Xu, Suzhou (CN); Zhen Jiang, Suzhou (CN); Xiaoyang Zheng, Suzhou (CN)

(73) Assignee: CENTEC NETWORKS (SU ZHOU) CO., LTD., Suzhou, Jiangsu (CN)

(*) Notice: Subject to any disclaimer, the term of this patent is extended or adjusted under 35 U.S.C. 154(b) by 102 days.

(21) Appl. No.: 16/318,356

(22) PCT Filed: Feb. 15, 2017

(86) PCT No.: PCT/CN2017/073644
§ 371 (c)(1),
(2) Date: Jan. 16, 2019

(87) PCT Pub. No.: WO2018/018875
PCT Pub. Date: Feb. 1, 2018

(65) Prior Publication Data
US 2019/0287582 A1  Sep. 19, 2019

(30) Foreign Application Priority Data
Jul. 28, 2016 (CN) .......................... 2016 1 0605711

(51) Int. Cl.
*G11C 7/00* (2006.01)
*G11C 7/10* (2006.01)
(Continued)

(52) U.S. Cl.
CPC ........ *G11C 7/1072* (2013.01); *G06F 9/30029* (2013.01); *G06F 13/00* (2013.01);
(Continued)

(58) Field of Classification Search
CPC .... G06F 13/00; G06F 9/30029; G11C 7/1015
(Continued)

(56) References Cited

U.S. PATENT DOCUMENTS 6,754,130 B1* 6/2004 Carter .................. G11C 7/1006
365/230.02
7,349,285 B2* 3/2008 Balasubramanian ........................
G06F 13/1663
365/230.05
(Continued)

FOREIGN PATENT DOCUMENTS

CN  103077123 A  5/2013
CN  103309626 A  9/2013
(Continued)

OTHER PUBLICATIONS

International Search Report for PCT/CN2017/073644 dated May 22, 2017 and its English translation provided by WIPO.
(Continued)

*Primary Examiner* — Huan Hoang
*Assistant Examiner* — Minh Dinh
(74) *Attorney, Agent, or Firm* — Ladas & Parry, LLP

(57) ABSTRACT

The present invention discloses a data processing method and system for a scalable multi-port memory. The multi-port memory is a 2-read n-write multi-port memory unit. The method comprises: assembling two 2R1W memories into one Bank memory unit; assembling n/2 Bank memory units in depth into a hardware architecture of one 2-read n-write multi-port memory unit; under one clock cycle, when data is written into the 2-read n-write multi-port memory unit, if the size of the data is less than or equal to the bit width of the 2R1W memory, writing the data into different 2R1W memories respectively; and if the size of the data is greater than the bit width of the 2R1W memory, waiting for a second clock cycle, and when the second clock cycle comes, writing the
(Continued)

high and low bits of the written data into the two 2R1W memories of one Bank memory unit respectively.

16 Claims, 10 Drawing Sheets

(51) Int. Cl.
  *G06F 9/30* (2018.01)
  *G11C 7/14* (2006.01)
  *G11C 7/22* (2006.01)
  *G06F 13/00* (2006.01)
(52) U.S. Cl.
  CPC .............. *G11C 7/1015* (2013.01); *G11C 7/14* (2013.01); *G11C 7/22* (2013.01); *Y02D 10/14* (2018.01)
(58) Field of Classification Search
  USPC .................................................... 365/189.16
  See application file for complete search history.

(56) References Cited

U.S. PATENT DOCUMENTS

| 2003/0039165 | A1  | 2/2003  | Shau et al. |
| 2011/0302376 | A1* | 12/2011 | Zhou ........................ G11C 8/16 711/149 |
| 2012/0314512 | A1  | 12/2012 | Kurokawa et al. |
| 2014/0052913 | A1  | 2/2014  | Wang et al. |
| 2014/0177324 | A1* | 6/2014  | Liu ........................ G11C 8/16 365/154 |

FOREIGN PATENT DOCUMENTS

| CN | 103314363 A | 9/2013 |
| CN | 104484128 A | 4/2014 |
| CN | 103886887 A | 6/2014 |
| CN | 104409098 A | 3/2015 |
| CN | 104484129 A | 4/2015 |
| CN | 104572573 A | 4/2015 |
| CN | 104637529 A | 5/2015 |
| CN | 106297861 A | 1/2017 |
| CN | 106302260 A | 1/2017 |

OTHER PUBLICATIONS

Written Opinion of the International Search Authority PCT/CN2017/073644 dated May 22, 2017 and its English translation provided by Google Translate.

Office Action and its Search Report dated Mar. 15, 2018 for Chinese Patent Application No. 201610605711 .0 (CN 106297861) and their translations provided by Google Translate and Global Dossier.

* cited by examiner

| Slice number | CCE number (SRAM based on 2R2W) |
|---|---|
| 2 | 1 (1x1) |
| 4 | 4 (2x2) |
| 6 | 9 (3x3) |
| 8 | 16 (4x4) |
| . | . |
| . | . |
| . | . |
| n | $(n/2)^2$ |

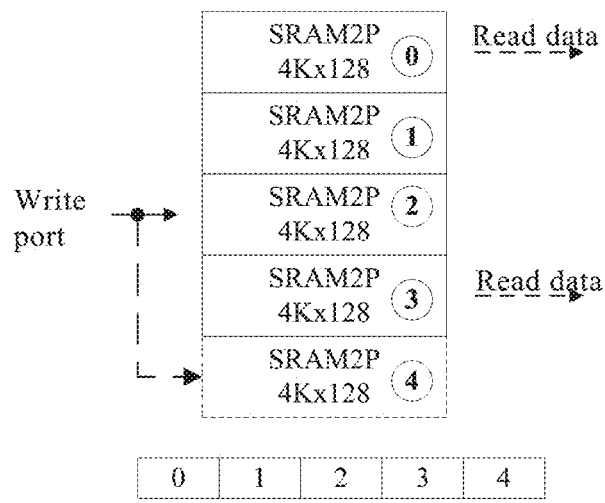

According to the depth and width of the 2R1W memory, selecting 2m+1 SRAM2P memories having the same depth and width to construct a hardware architecture of the 2R1W memory When the data is written into and/or read from the 2R1W memory, associating the data in the main memories and the data in the secondary memory according to a current pointer position of the data, and performing XOR operation thereon to complete the writing and reading of the data

FIG. 11

| Slice number | CCE number (SRAM based on 2RnW) |
|---|---|
| 4 | 2 |
| 6 | 3 |
| 8 | 4 |
| . | . |
| . | . |
| . | . |
| n | n/2 |

DATA PROCESSING METHOD AND DATA PROCESSING SYSTEM FOR SCALABLE MULTI-PORT MEMORY

CROSS REFERENCE TO RELATED APPLICATIONS

The present application is the U.S. national phase of PCT/CN2017/073644 filed on Feb. 15, 2017, which claims the priority to the Chinese Patent Application No. 201610605711.0 filed on Jul. 28, 2016, the disclosures of which are incorporated herein by reference in their entireties.

TECHNICAL FIELD

The present invention relates to the field of network communication technologies, and more particularly, to a data processing method and a data processing system for a scalable multi-port memory.

BACKGROUND

When an Ethernet switch chip is designed, it is usually necessary to use a large-capacity multi-port memory, such as a 2-read and 1-write (supporting 2 read ports and 1 write port simultaneously) memory, a 1-read and 2-write memory, a 2-read and 2-write memory or a memory with more ports.

Usually, suppliers generally provide only one read or write memory, a 1-read and 1-write memory, and two read or write memories. Thus, the designer can only construct a multi-port memory based on the basic memory units described above.

The packet buffer is a special type of multi-port memory whose writing is controllable, that is, sequential writing, but whose reading is random. In one of the user's needs, for the Ethernet switch chip with the uni-direction switching capacity 2.4 Tbps, in order to achieve line rate writing and reading, each minimal packet (64 bytes) only costs the time of 280ps, which requires a core frequency as high as 3.571 GHz. Such a requirement is currently not achievable with existing semiconductor processes. In order to achieve the above objective, the usual method is to divide the entire chip into multiple independent packet forwarding and processing units for parallel processing. The English name of the packet forwarding and processing unit is Slice. For example, if 4 Slices are obtained after division for parallel processing, the data bandwidth that each slice needs to process is reduced, and the requirement on the core frequency is also reduced to ¼ of the original core frequency. Correspondingly, in the implementation process of the solution, for the packet buffer, it is necessary to provide 8 ports for the 4 Slices to access at the same time, 4 of which are read ports and 4 of which are write ports.

In addition, for the multi-port memory, not only the portability of the design, but also the scalability of the design needs to be considered. The designed memory architecture can be conveniently expanded from 4 slices to 6 or 8 or more slices.

In general, on the basis that the port type of the SRAM is 1-read or 1-write, 2-read or 2-write, and 1-write or 2-read, the number of ports of the SRAM is increased by customized design, for example, a method for modifying the memory unit, and algorithm design.

The period of the customized design cycle is generally long, as spice simulation is required, and a memory compiler is also needed to generate the SRAM of different sizes and types. For suppliers, it usually takes six to nine months to provide a new type of SRAM, and such a customized design is strongly related to the specific process (such as 14 nm and 28 nm of GlobalFoundries or 28 nm and 16 nm of TSMC). Once the process changes, the customized-designed SRAM library needs to be redesigned.

The algorithm design is based on the off-the-shelf SRAM type provided by the suppliers. The multi-port memory is realized by algorithms. The greatest advantage is to avoid the customized design and shorten the time. Simultaneously, the design is not related to technology libraries, and can be easily transplanted between different technology libraries.

FIG. 1 shows a 4-read and 4-write memory architecture supporting the access by four slices designed by the algorithm design. In the present embodiment, a large-capacity 2R2 W SRAM is designed by using the 1R1W SRAM2D, which logically requires four 65536-depth 2304-width SRAM2Ds. Since the capacity of one single physical SRAM2D can not meet the above requirements, one 65536-depth 2304-width logical SRAM needs to be divided into multiple physical SRAMs. For example, 32 16384-depth 288-width physical blocks can be obtained after division. In this way, a total of 32×4=128 physical blocks is required. With the above 2R2 W SRAM as a basic unit, a 4R4 W SRAM with the size of 18M bytes is constructed.

As shown in FIG. 2, a total of four 65536-depth 2304-width 2R2 W SRAMs is logically required, that is, the number of the required SRAM2D (with a 16384-depth and a 288-width) physical blocks is 512. It can be known according to the existing data that under the 14 nm technological condition, the size of one 16384-depth 288-width SRAM2D physical block is 0.4165 square centimeters, and the power consumption is 0.108 Watts (the technological conditions are the fastest when a core voltage is equal to 0.9V and a junction temperature is equal to 125 DEG C.). Although the above method for constructing the SRAM of more ports by copying the basic unit SRAM provided by the technology library into multiple copies is obvious in design principle, the area overhead is very large. By taking the above solution as an example, only the area of the 4-read 4-write SRAM of 18M bytes occupies 213.248 square centimeters, the total power consumption is 55.296 Watts, and the overhead of inserting Decap and DFT as well as placing and routing has not been considered here yet. The multi-port SRAM designed by such algorithm design occupies a huge area and has huge total power consumption.

Simultaneously, such a design is very poor in scalability. If the architecture such as 8 slices needs to be supported, 16 ports are needed, wherein there are 8 read ports and 8 write ports. The SRAM needs to be made to be 8-read 8-write, and the area occupied by the SRAM and the power consumption are doubled.

As shown in FIG. 3A, in the prior art, another algorithm design method uses the 2R2 W SRAM as a basic unit to implement the packet buffer of multiple ports by spatial division. By taking the packet buffer architecture of 4 slices as an example, each X? Y? is a CCE, the English full name is Criss-Cross Element, and the Chinese translation is "纵横内存单元". Two horizontal CCEs form a CCHG, the English full name of the CCHG is: Criss-Cross Horizontal Group, and the Chinese translation is: 纵横内存水平分组. Two vertical CCEs form a CCVG, the English full name of the CCVG is: Criss-Cross Vertical Group, and the Chinese translation is: 纵横内存垂直分组.

In the existing algorithm design, each CCE is a 2R2 W SRAM logic block with the size of 4.5M bytes. There are four such SRAM logic blocks in total, which form the 4R4 W SRAM, and the size is 18M bytes (4.5M×4=18M).

S0, S1, S2, and S3 represent 4 slices. Each slice comprises, for example, six 100GE ports. A packet input from slice0 or slice1 to slice0 or slice1 is stored into X0Y0. A packet input from slice0 or slice1 to slice2 or slice3 is stored into X1Y0. A packet input from slice2 or slice3 to slice0 or slice1 is stored into X0Y1. A packet input from slice2 or slice3 to slice2 or slice3 is stored into X1Y1. For a multicast packet, the multicast packet from Slice0 or Slice1 is simultaneously stored in X0Y0 and X1Y0. Further, when the packet is read, slice0 or slice1 will read the packet from X0Y0 or X0Y1, and slice2 or slice3 will read the packet from X1Y0 or X1Y1.

As shown in FIG. 3B, when the 8R8 W memory is constructed based on 2R2 W, each CCE is also a 2R2 W SRAM logic block, the size is 4.5M bytes, and there is a total of $(8/2)^2$, i.e., 16 such SRAM logic blocks, to construct the 8R8 W SRAM. The data writing and reading thereof are similar to the above 4R4 W memory, and will not be repeated in detail herein.

FIG. 4 shows an architecture diagram of each CCE in the algorithm design of the prior art, one X?Y? logically requires four 16384-depth 2304-width SRAMs, and each logic 16384-depth 2304-width SRAM can be cutted into eight 16384-depth 288-width physical SRAM2Ds. Such a packet buffer of 18M bytes requires a total of 4×4×8=128 16384-depth 288-width physical SRAM2Ds. The total area is 51.312 square centimeters, and the total power consumption is 13.824 Watts (the technological conditions are the fastest when a core voltage is equal to 0.9V and a junction temperature is equal to 125 DEG C.).

The area and power consumption overhead of the above second algorithm design is only ¼ of the first algorithm design described above. However, the requirement on the scalability is still not well met.

As shown in FIG. 5, the multi-port packet buffer designed based on the 2R2 W SRAM has the problem about scalability. The number of the CCEs implemented based on the 2R2 W memory is equal to (the number of Slices/2)^2, that is, the number of the CCEs is obtained by dividing the number of the slices by 2 and then squaring by 2. As the number of the slices is increased, the number of the CCEs will be too large to be realized. For the extension of 6 slices, 8 slices, and more ports, the number of the CCEs is increased step by step, causing the system to be difficult to load.

SUMMARY

In order to solve the above technical problem, an objective of the present invention is to provide a data processing method and a data processing system for a scalable multi-port memory.

In order to realize one of the objectives of the above invention, an embodiment of the present invention provides a data processing method for a scalable multi-port memory, wherein the multi-port memory is a 2-read n-write multi-port memory unit, and n is an even number.

The method comprises: assembling two 2R1W memories in parallel into one Bank memory unit; assembling n/2 Bank memory units in depth into a hardware architecture of one 2-read n-write multi-port memory unit; under one clock cycle, when data is written into the 2-read n-write multi-port memory unit by n write ports, if the size of the data is less than or equal to the bit width of the 2R1W memory, writing the data into different 2R1W memories respectively; and if the size of the data is greater than the bit width of the 2R1W memory, waiting for a second clock cycle, and when the second clock cycle comes, writing the high and low bits of the written data into the two 2R1W memories of one Bank memory unit respectively.

As a further improvement on the embodiment of the present invention, the method further comprises: under one clock cycle, when the data is read from two read ports of the 2-read n-write multi-port memory unit, if the size of the data is less than or equal to the bit width of the 2R1W memory, selecting a matched read port in the 2-read n-write multi-port memory unit to directly read the data; and if the size of the data is greater than the bit width of the 2R1W memory, waiting for the second clock cycle, and when the second clock cycle comes, selecting a matched read port in the 2-read n-write multi-port memory unit to directly read the data.

As a further improvement on the embodiment of the present invention, the method further comprises: directly forming the hardware architecture of an n-read n-write memory based on n/2 2-read n-write multi-port memory units; under one clock cycle, when the data is written into the n-read n-write multi-port memory by n write ports, if the size of the data is less than or equal to the bit width of the 2R1W memory, writing the data into different 2R1W memories respectively according to a destination port of the data; and if the size of the data is greater than the bit width of the 2R1W memory, waiting for the second clock cycle, and when the second clock cycle comes, writing the high and low bits of the written data into the two 2R1W memories of one Bank memory unit respectively according to the destination port of the data.

As a further improvement on the embodiment of the present invention, the method further comprises: under one clock cycle, when the data is read from two of the read ports of the n-read n-write multi-port memory, if the size of the data is less than or equal to the bit width of the 2R1W memory, selecting a matched read port in the n-read n-write multi-port memory to directly read the data; and if the size of the data is greater than the bit width of the 2R1W memory, waiting for the second clock cycle, and when the second clock cycle comes, selecting a matched read port in the n-read n-write multi-port memory to directly read the data.

As a further improvement on the embodiment of the present invention, the method further comprises: according to the depth and width of the 2R1W memory, selecting 2m+1 SRAM2P memories having the same depth and width to construct a hardware architecture of the 2R1W memory, m being a positive integer, wherein each SRAM2P memory having M pointer addresses, one of the plurality of SRAM2P memories is a secondary memory, and the rest SRAM2P memories are main memories; and when the data is written into and/or read from the 2R1W memory, associating the data in the main memories and the data in the secondary memory according to a current pointer position of the data, and performing XOR operation thereon to complete the writing and reading of the data.

In order to realize one of the objectives of the present invention, an embodiment of the present invention provides a data processing system for a scalable multi-port memory, wherein the multi-port memory is a 2-read n-write multi-port memory unit, and n is an even number. The system comprises: a data constructing module and a data processing module.

The data constructing module is specifically configured to assemble two 2R1W memories in parallel into one Bank memory unit; and assemble n/2 Bank memory units in depth into a hardware architecture of one 2-read n-write multi-port memory unit.

The data processing module is specifically configured to, under one clock cycle, when data is written into the 2-read n-write multi-port memory unit by n write ports, if the size of the data is less than or equal to the bit width of the 2R1W memory, write the data into different 2R1W memories respectively; and if the size of the data is greater than the bit width of the 2R1W memory, wait for a second clock cycle, and when the second clock cycle comes, write the high and low bits of the written data into the two 2R1W memories of one Bank memory unit respectively.

As a further improvement on the embodiment of the present invention, the data processing module is further configured to: when determining that under one clock cycle, the data is read from two read ports of the 2-read n-write multi-port memory unit, if the size of the data is less than or equal to the bit width of the 2R1W memory, select a matched read port in the 2-read n-write multi-port memory unit to directly read the data; and if the size of the data is greater than the bit width of the 2R1W memory, wait for the second clock cycle, and when the second clock cycle comes, select a matched read port in the 2-read n-write multi-port memory unit to directly read the data.

As a further improvement on the embodiment of the present invention, the data constructing module is further configured to: directly form the hardware architecture of an n-read n-write memory based on n/2 2-read n-write multi-port memory units.

The data processing module is further configured to, when determining that under one clock cycle, the data is written into the n-read n-write multi-port memory by n write ports, if the size of the data is less than or equal to the bit width of the 2R1W memory, write the data into different 2R1W memories respectively according to a destination port of the data; and if the size of the data is greater than the bit width of the 2R1W memory, wait for the second clock cycle, and when the second clock cycle comes, write the high and low bits of the written data into the two 2R1W memories of one Bank memory unit respectively according to the destination port of the data.

As a further improvement on the embodiment of the present invention, the data processing module is further configured to: when determining that under one clock cycle, the data is read from two of the read ports of the n-read n-write multi-port memory, if the size of the data is less than or equal to the bit width of the 2R1W memory, select a matched read port in the n-read n-write multi-port memory to directly read the data; and if the size of the data is greater than the bit width of the 2R1W memory, wait for the second clock cycle, and when the second clock cycle comes, select a matched read port in the n-read n-write multi-port memory to directly read the data.

As a further improvement on the embodiment of the present invention, the data constructing module is further configured to: according to the depth and width of the 2R1W memory, select 2m+1 SRAM2P memories having the same depth and width to construct a hardware architecture of the 2R1W memory, m being a positive integer.

Each SRAM2P memory has M pointer addresses, one of the plurality of SRAM2P memories is a secondary memory, and the rest SRAM2P memories are main memories.

When the data is written into and/or read from the 2R1W memory, the data processing module is further configured to, according to a current pointer position of the data, associate the data in the main memories and the data in the secondary memory, and perform XOR operation thereon to complete the writing and reading of the data.

Compared with the prior art, according to the data processing method and the data processing system for a scalable multi-port memory of the present invention, the SRAM of more ports is constructed by algorithms based on existing types of SRAMs, and the multi-port SRAM is supported to the greatest extent by only a minimal cost. In the implementation process, complex control logics and additional multi-port SRAM or register array resources are avoided. By using the uniqueness of the packet buffer and by using spatial division and time division, the packet buffer of multiple ports can be realized by only simple XOR operation. Meanwhile, all buffer resources of the multi-port memory implemented by the present invention can be completely shared between any input ports. Logically, the multi-port memory can be constructed by adopting less CCEs, and the port extension is easy to implement. The present invention has lower power consumption and a faster processing speed, and saves more resources or areas. The packet buffer architecture has better scalability, is easy to implement and saves manpower and material costs.

BRIEF DESCRIPTION OF THE DRAWINGS

FIG. 10a is a schematic diagram of a packet buffer logic unit of a 2R1W memory formed by algorithm design according to a fourth embodiment of the present invention.

FIG. 10b is a structural schematic diagram of a memory block number mapping table corresponding to FIG. 10a.

FIG. 11 is a schematic flowchart of a data processing method for a 2R1W memory provided by a fifth embodiment of the present invention.

DETAILED DESCRIPTION

The present invention will be described in detail below in conjunction with respective embodiments shown in the accompanying drawings. However, these embodiments are not intended to limit the invention, and the structures, methods, or functional changes made by those ordinary skilled in the art in accordance with the embodiments are included in the protective scope of the present invention.

Figure 1:
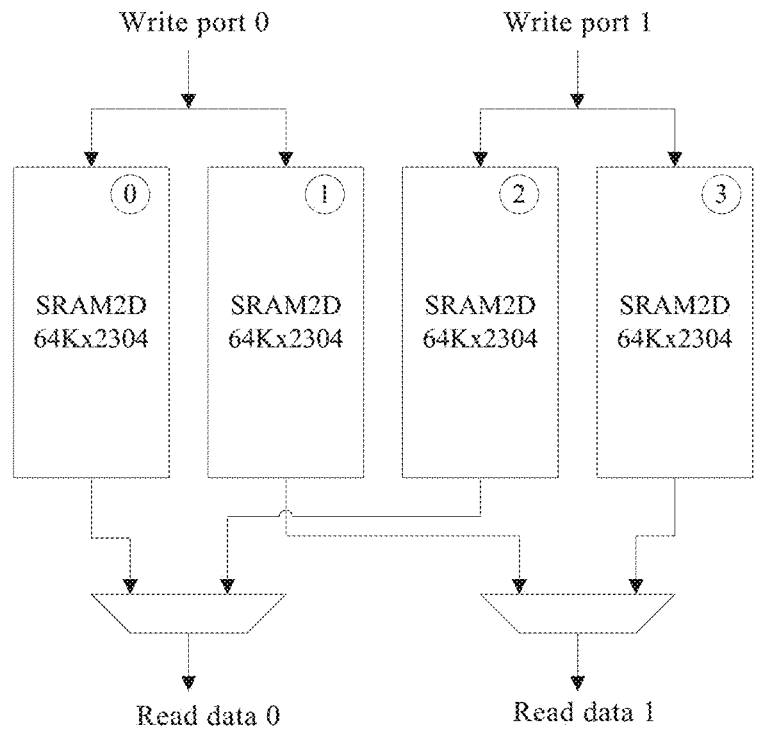
FIG. 1 is a schematic diagram of a packet buffer logic unit of a 2R2 W memory implemented by algorithm design based on a 1R1W memory in the prior art.
Figure 2:
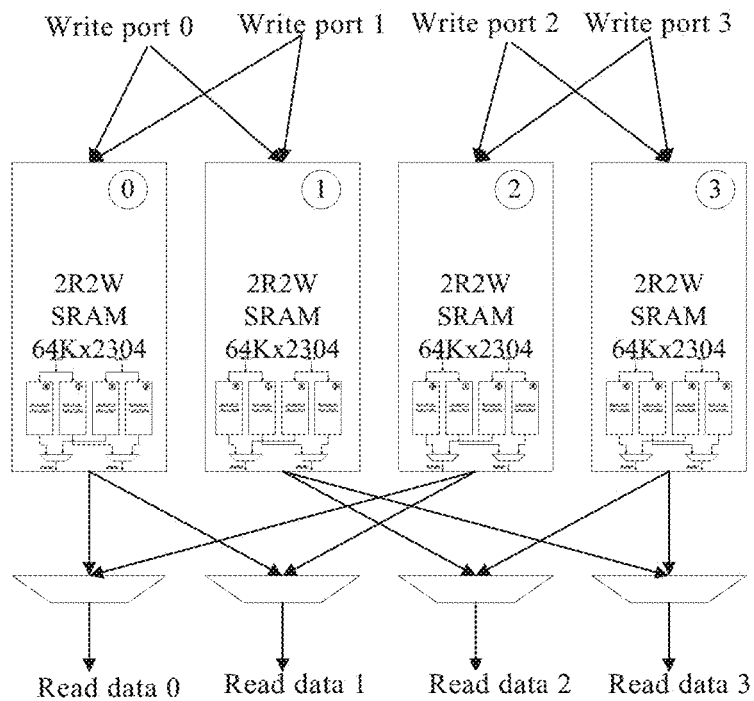
FIG. 2 is a schematic diagram of a packet buffer logic unit of a 4R4 W memory implemented by algorithm design based on a 2R2 W memory in the prior art.
Figure 3A:
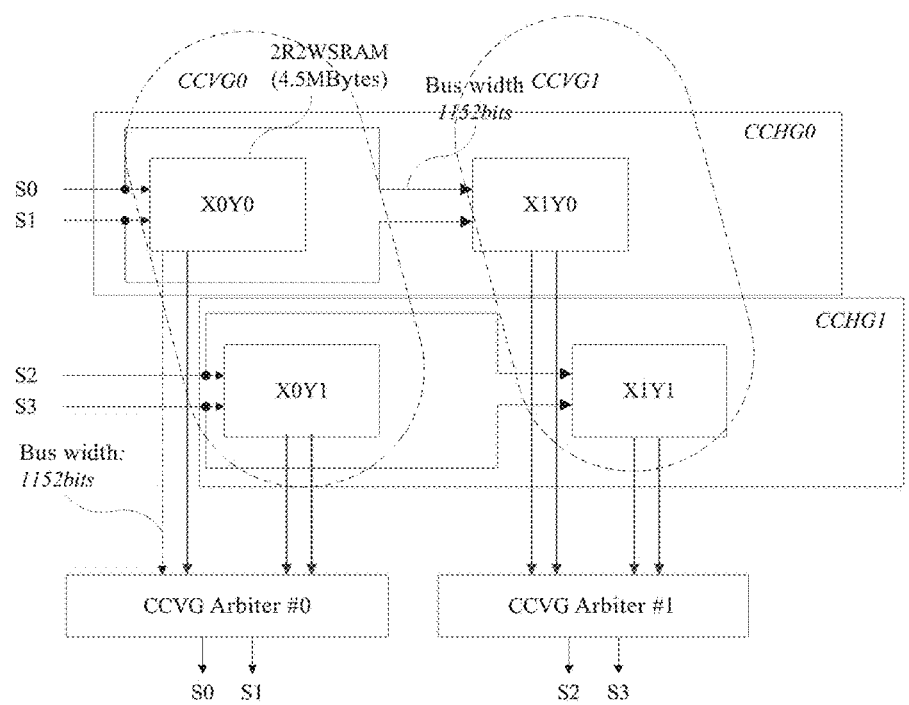
FIG. 3A is a schematic diagram of a packet buffer architecture of a 4R4 W memory implemented by another algorithm design based on a 2R2 W memory in the prior art.
Figure 3B:
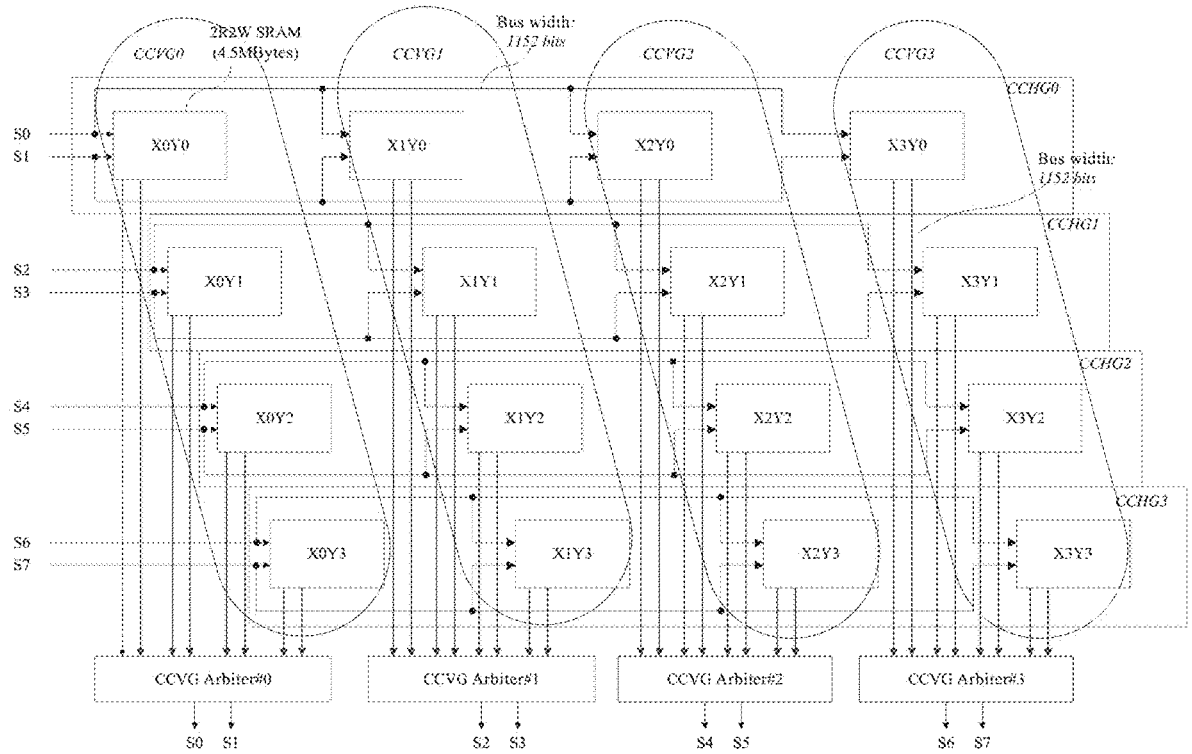
FIG. 3B is a schematic diagram of a packet buffer architecture of an 8R8 W memory implemented by another algorithm design based on a 2R2 W memory in the prior art.
Figures 4, 5:
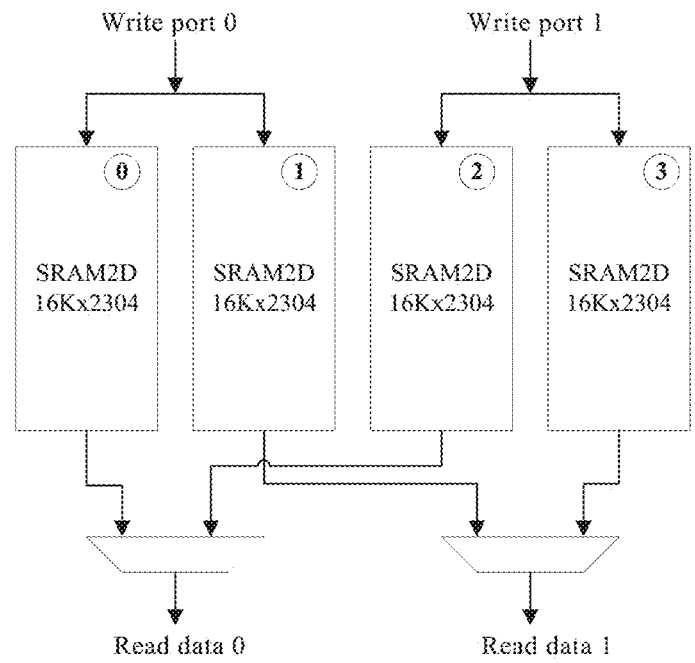
FIG. 4 is a schematic diagram of a packet buffer logic unit of one of CCEs in FIG. 3.
FIG. 5 is a schematic diagram of a comparison relationship between a 2R2 W memory and the number of CCEs when algorithm design is adopted to expand memory ports based on the 2R2 W memory in the prior art.
Figure 6:
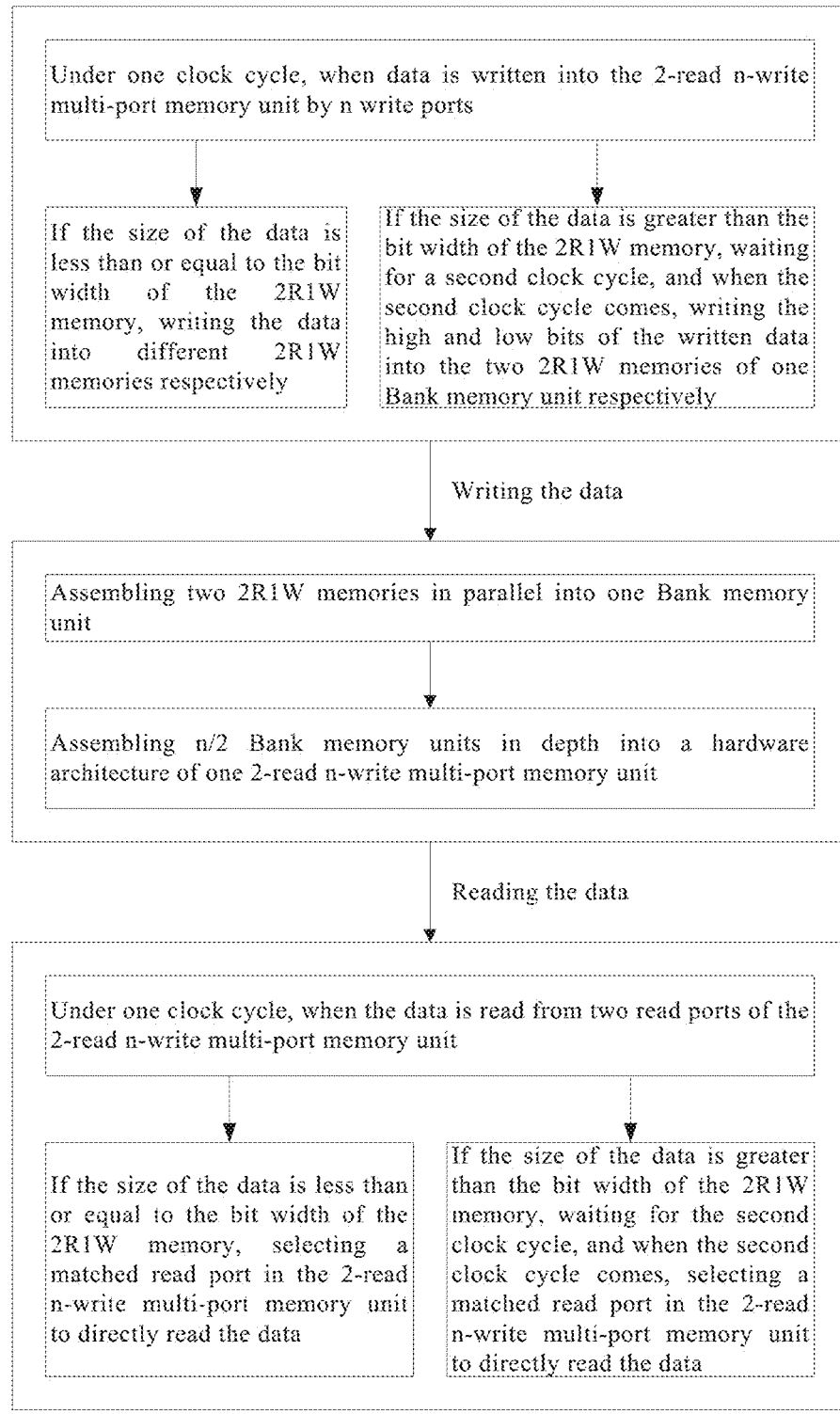
FIG. 6 is a schematic flowchart of a data processing method for a 2-read n-write scalable multi-port memory according to an embodiment of the present invention.

FIG. 6 shows a data processing method for a scalable multi-port memory provided by one embodiment of the present invention. In the present embodiment, the multi-port memory is a 2-read n-write multi-port memory unit, and n is an even number.

The method comprises: assembling two 2R1W memories in parallel into one Bank memory unit; assembling n/2 Bank memory units in depth into a hardware architecture of one 2-read n-write multi-port memory unit; under one clock cycle, when data is written into the 2-read n-write multi-port memory unit by n write ports, if the size of the data is less than or equal to the bit width of the 2R1W memory, writing the data into different 2R1W memories respectively; and if the size of the data is greater than the bit width of the 2R1W memory, waiting for a second clock cycle, and when the second clock cycle comes, writing the high and low bits of the written data into the two 2R1W memories of one Bank memory unit respectively.

Under one clock cycle, when the data is read from two read ports of the 2-read n-write multi-port memory unit, if the size of the data is less than or equal to the bit width of the 2R1W memory, a matched read port in the 2-read n-write multi-port memory unit is selected to directly read the data.

If the size of the data is greater than the bit width of the 2R1W memory, the second clock cycle is waited, and when the second clock cycle comes, a matched read port in the 2-read n-write multi-port memory unit is selected to directly read the data.

In the preferred embodiment of the invention, there are five methods to establish the 2R1W memory.

Figure 7:
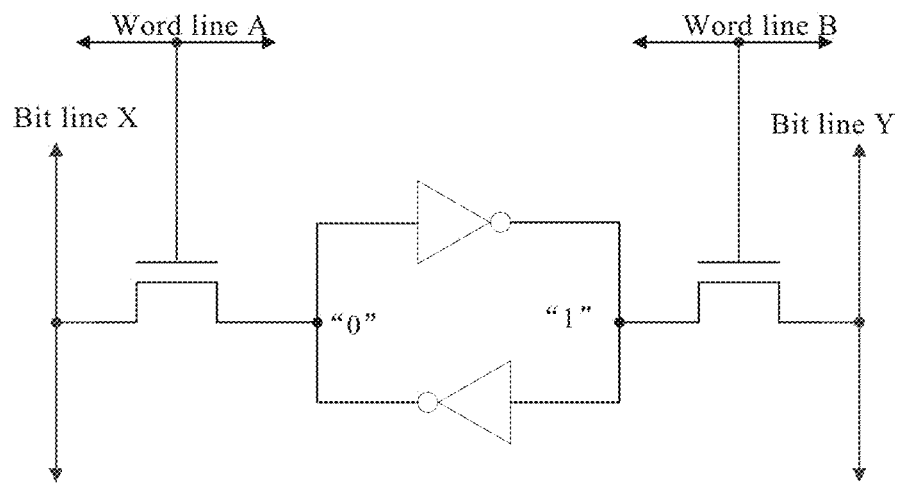
FIG. 7 is a schematic diagram of a digital circuit structure of a 2R1W memory formed by customized design according to a first embodiment of the present invention.

As shown in FIG. 7, in the first embodiment, on the basis of the 6T SRAM, one word line is divided into a left one and a right one, so that two read ports can be made for simultaneous operation or one write port is made. In this way, the reading of the data from a left MOS transistor and the reading of the data from a right MOS transistor can be simultaneously performed. It should be noted that the data read by the right MOS transistor cannot be used till being inverted. In order not to affect the speed of data reading, a pseudo-differential amplifier is required as the reading sense amplifier. Thus, the area of the 6T SRAM is unchanged, and the only cost is to double the word line, thereby ensuring that the overall memory density is basically unchanged.

Figure 8:
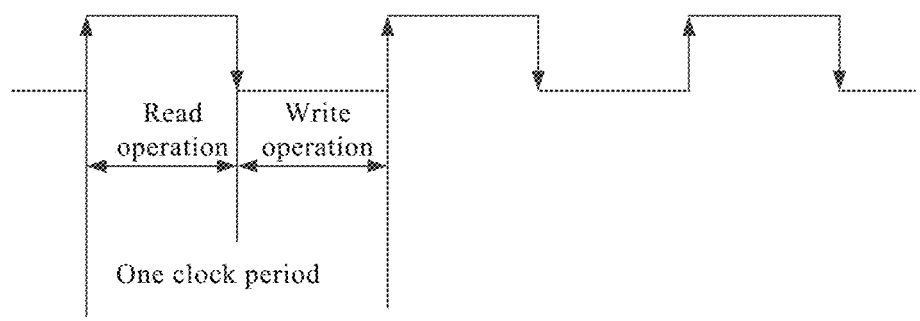
FIG. 8 is a schematic diagram of read write timing operation of a 2R1W memory formed by customized design according to a second embodiment of the present invention.

FIG. 8 shows a schematic diagram of a read-write operation flow of a 2R1W memory formed by customized design according to the second embodiment of the present invention.

By customized design, the ports of the SRAM can be increased, and one word line is cut into two word lines, to increase to two read ports. The technique of time-sharing operation may also be adopted, that is, the read operation is performed on the rising edge of a clock, and the write operation is performed on the falling edge of the clock. In this way, a basic 1-read or 1-write SRAM can be expanded to the 1-read and 1-write SRAM type, that is, one read operation and one write operation can be performed simultaneously, and the memory density is basically unchanged.

Figure 9:
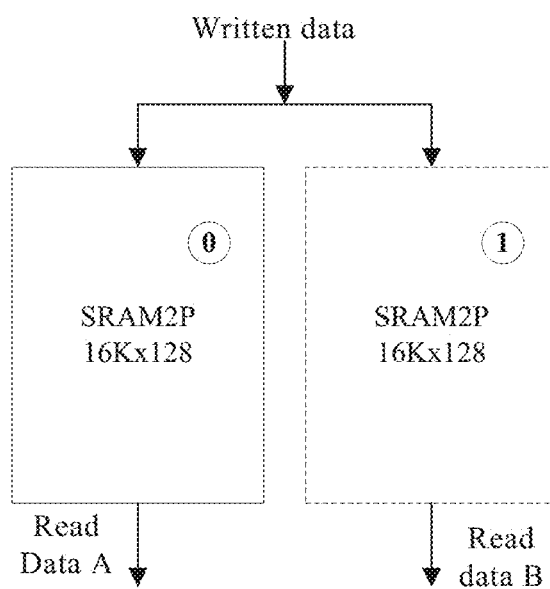
FIG. 9 is a schematic diagram of a packet buffer logic unit of a 2R1W memory formed by algorithm design according to a third embodiment of the present invention.

FIG. 9 shows a schematic diagram of a read-write operation flow of a 2R1W memory formed by algorithm design according to the third embodiment of the present invention.

In the present embodiment, the 2R1W SRAM constructed based on the SRAM2P is taken as an example, the SRAM2P is an SRAM type capable of supporting 1-read and 1-read/write, that is, two read operations can be simultaneously performed or one read operation and one write operation can be performed on the SRAM2P.

In the present embodiment, the 2R1W SRAM is constructed on the basis of the SRAM2P by copying one SRAM. In this example, the SRAM2P_1 on the right is a copy of the SRAM2P_0 on the left. When in the specific operation, the two SRAM2Ps are used as 1-read and 1-write memories for use. When data is written, the data is written to the left and right SRAM2Ps at the same time. When the data is read, data A is fixedly read from the SRAM2P_0, and the data B is fixedly read from the SRAM2P_1, so that one write operation and two read operations can be performed concurrently.

FIG. 10*a* and FIG. 10*b* show schematic diagrams of a read-write operation flow of the 2R1W memory formed by algorithm design according to the fourth embodiment.

In the present embodiment, a logically integral 16384-depth SRAM is divided into logically four 4096-depth SRAM2Ps, which are numbered sequentially as 0, 1, 2, and 3. An additional 4096-depth SRAM is arranged, is numbered as 4, and is used as a solution to read-write conflicts. For reading the data A and the data B, it is always ensured that the two read operations can be performed concurrently. When the addresses of the two read operations are in different SRAM2Ps, since any one SRAM2P can be configured as the 1R1W type, there are no read-write conflicts. When the addresses of two read operations are in the same SRAM2P block, for example, both in the SRAM2P_0, since the same SRAM2P can only provide 2 ports for simultaneous operation at most, at this point, the ports are occupied by the two read operations. If one write operation is just to be written into the SRAM2P_0, then such data is written into the fourth SRAM2P_4 block of the memory.

In the present embodiment, a memory block mapping table is required to record which memory block stores valid data. As shown in FIG. 10*b*, the depth of the memory block mapping table is the same as the depth of one memory block, that is, a 4096 depth. In each entry, the numbers from 0 to 4 of all memory blocks are sequentially stored after initialization. In the example of FIG. 10*a*, since the SRAM2P_0 has the read-write conflicts when the data is written, the data is actually written to the SRAM2P_4. At this point, the read operation also reads the corresponding content in the memory mapping table, and the original content is {0, 1, 2, 3, 4}, which becomes {4, 1, 2, 3, 0} after modification. The first block number and the fourth block number are exchanged, indicating that the data is actually written to the SRAM2P_4, and the SRAM2P_0 becomes a backup entry.

When the data is read, it is necessary to firstly read the memory block number mapping table of the corresponding address, to check which memory block the valid data is stored in. For example, if the data of the address 5123 is to be read, the content stored in the address 1027 (5123−4096=1027) of the memory block number mapping table is firstly read. The content of the address 1027 of the corresponding storage block is read according to the number of the second column.

For the data writing operation, the memory block number mapping table is required to provide one read port and one write port. For two data reading operations, the memory block number mapping table is required to provide two read ports, so that the memory block number mapping table is required to provide three read ports and one write port in total, and these 4 access operations must be performed simultaneously.

FIG. 11 shows a fifth embodiment. In the preferred embodiment of the present invention, a method for constructing the 2R1W memory comprises: according to the depth and width of the 2R1W memory, selecting 2m+1 SRAM2P memories having the same depth and width to construct a hardware architecture of the 2R1W memory, m being a positive integer.

Multiple SRAM2P memories are sequentially SRAM2P (0), SRAM2P(1) . . . SRAM2P(2m) according to an arrangement sequence. Each SRAM2P memory has M pointer addresses, one of the multiple SRAM2P memories is a secondary memory, and the rest SRAM2P memories are main memories.

In the preferred embodiment of the invention, the product of the depth and width of each SRAM2P memory is equal to (the product of the depth and width of the 2R1W memory)/2m.

For the convenience of description, the SRAM memory which has the m value of 2 and is the 16384-depth 128-width 2R1W memory is described in detail below.

In this specific example, the multiple SRAM2P memories are sequentially SRAM2P(0), SRAM2P(1), SRAM2P(2), SRAM2P(3) and SRAM2P(4) according to the arrangement sequence, wherein the SRAM2P(0), SRAM2P(1), SRAM2P(2) and SRAM2P(3) are the main memories, and the SRAM2P(4) is the secondary memory. The depth and width of each SRAM2P memory are 4096 and 128 respectively. Correspondingly, each SRAM2P memory has 4096 pointer addresses. If the pointer address of each SRAM2P memory is independently identified, the pointer address of each SRAM2P memory is 0-4095. If the addresses of all the main memories are arranged in order, the range of all the pointer addresses is 0-16383. In this example, the SRAM2P(4) is used to resolve port conflicts. In the present embodiment, the requirement can be met without adding the memory block number mapping table.

Further, based on the above hardware architecture, the method further comprises: when the data is written into and/or read from the 2R1W memory, associating the data in the main memories and the data in the secondary memory according to a current pointer position of the data, and performing XOR operation thereon to complete the writing and reading of the data.

In the preferred embodiment of the invention, the data writing process is as follows.

The writing address of the current data is obtained as W(x, y). x represents the arrangement position of the SRAM2P memory where the written data is located, and $0 \leq x < 2m$. y represents the specific pointer address in the SRAM2P memory where the written data is located, and $0 \leq y \leq M$.

The data in the rest main memories which have the same pointer address as the writing address are obtained and are subjected to the XOR operation with the current written data at the same time. The result of the XOR operation is written into the same pointer address of the secondary memory.

Figure 12:
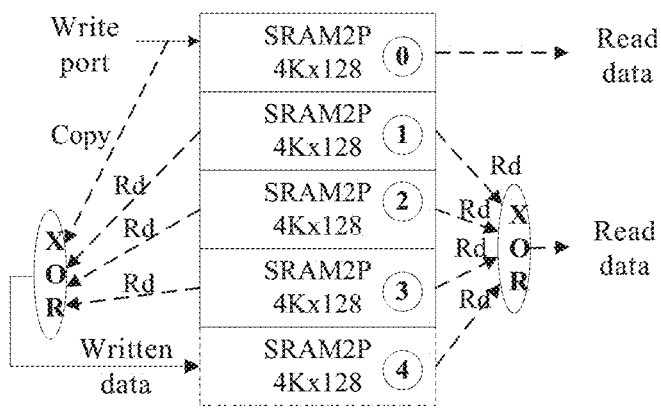
FIG. 12 is a schematic diagram of a packet buffer logic unit of a 2R1W memory provided in the fifth embodiment of the present invention.

As shown in FIG. 12, in a specific example of the present invention, in a specific example of the present invention, the data 128-bit all "1" is written to the pointer address "5" in the SRAM2P(0), that is, the writing address of the current data is W(0,5). In the process of data writing, in addition to directly writing the data 128-bit all "1" to the pointer address "5" in the SRAM2P(0) of the specified position, meanwhile, the data of the rest main memories at the same pointer address need to be read. It is assumed that the data read from the pointer address "5" in the SRAM2P(1) is 128-bit all "1", the data read from the pointer address "5" in the SRAM2P (2) is 128-bit all "0", and the data read from the pointer address "5" in the SRAM2P(3) is 128-bit all "1", then the data 128-bit all "1", 128-bit all "0", 128-bit all "1" and 128-bit all "1" are subjected to the XOR operation. The result "1" of the XOR operation is simultaneously written to the pointer address "5" in the SRAM2P(4). In this way, it is ensured that the two read ports and one write port of the 2R1W memory operate simultaneously.

Further, in the preferred embodiment of the present invention, the data reading process is as follows.

If the reading addresses of the current two pieces of read data are in the same SRAM2P memory, then the reading addresses of the two pieces of read data are respectively obtained as R1 (x1, y1), R2 (x2, y2). x1 and y1 both represent the arrangement positions of the SRAM2P memory in which the read data are located, $0 \leq x1 < 2m$, and $0 \leq x2 < 2m$. y1 and y2 both represent the specific pointer addresses in the SRAM2P memory in which the read data are located, $0 \leq y1 \leq M$, and $0 \leq y2 \leq M$.

The read data stored in one of the reading addresses R1 (x1, y1) is optionally selected, and the currently stored data is directly read from the currently designated reading address.

The data in the rest main memories and the data stored in the secondary memory which have the same pointer address as the other reading address are obtained, and are subjected to the XOR operation. The result of the XOR operation is output as the stored data of the other reading address.

Then as shown in FIG. 12, in a specific example of the present invention, there are two pieces of read data, and the pointer addresses are the pointer address "2" in the SRAM2P(0) and the pointer address "5" in the SRAM2P(0) respectively. That is, the reading addresses of the current data are R (0, 2) and R (0, 5).

In the process of reading the data from the 2R1W memory, since each SRAM2P can only guarantee that one read port and one write port operate simultaneously, the read port directly reads the data from the pointer address "2" in the SRAM2P(0), but the request of the other read port cannot be met. Correspondingly, the present invention solves the problem of simultaneously reading the data by the two read ports by using the XOR operation.

For the data in R(0,5), the data of the pointer addresses "5" of other three main memories and the secondary memory are read respectively and are subjected to the XOR operation. By following the above example, the data read from the pointer address "5" in the SRAM2P(1) is "1", the data read from the pointer address "5" in the SRAM2P(2) is "0", the data read from the pointer address "5" in the SRAM2P(3) is 128-bit all "1", and the data read from the pointer address "5" in the SRAM2P(4) is 128-bit all "1". The data 128-bit all "1", 128-bit all "1", 128-bit all "0" and 128-bit all "1" are subjected to the XOR operation to obtain 128-bit "1", and the result 128-bit all "1" of the XOR operation is used as the stored data of the pointer address "5" in the SRAM2P(0) for output. The result of the data obtained by the above process is completely consistent with the data stored in the pointer address "5" in the SRAM2P(0). Thus, according to the current pointer position of the data, the data in the main memories and the data in the secondary memory are associated and are subjected to the XOR operation thereon to complete the writing and reading of the data.

In one embodiment of the present invention, if the reading addresses of the current two pieces of read data are in different SRAM2P memories, the data corresponding to the pointer addresses in the different SRAM2P memories are directly obtained for independent output.

As shown in FIG. 12, in a specific example of the present invention, there are two pieces of read data, and the pointer addresses are the pointer address "5" in the SRAM2P(0) and the pointer address "10" in the SRAM2P(1) respectively. That is, the current data reading addresses are R (0, 5) and R (1, 10).

In the process of reading the data from the 2R1W memory, each SRAM2P can ensure that one read port and one write port operate simultaneously. Therefore, in the data reading process, the data is directly read from the pointer address "5" in the SRAM2P(0), and the data is directly from the pointer address "10" in the SRAM2P(I). Thus, it is ensured that the two read ports and one write port of the 2R1W memory simultaneously operate, which is not repeated in detail herein.

It should be noted that if each SRAM2P is further divided logically, for example, is divided into 4m SRAM2Ps having the same depth, and then the above 2R1W SRAM can be constructed by only adding a memory area of ¼m. Correspondingly, the number of the physical SRAM blocks is also increased by nearly 2 times, and a lot of area overhead will be occupied in actual locating and wiring. Of course, the present invention is not limited to the above specific embodiments, and other solutions using the XOR operation to expand the memory ports are also included in the protective scope of the present invention, which is not repeated in detail herein.

Figure 13:
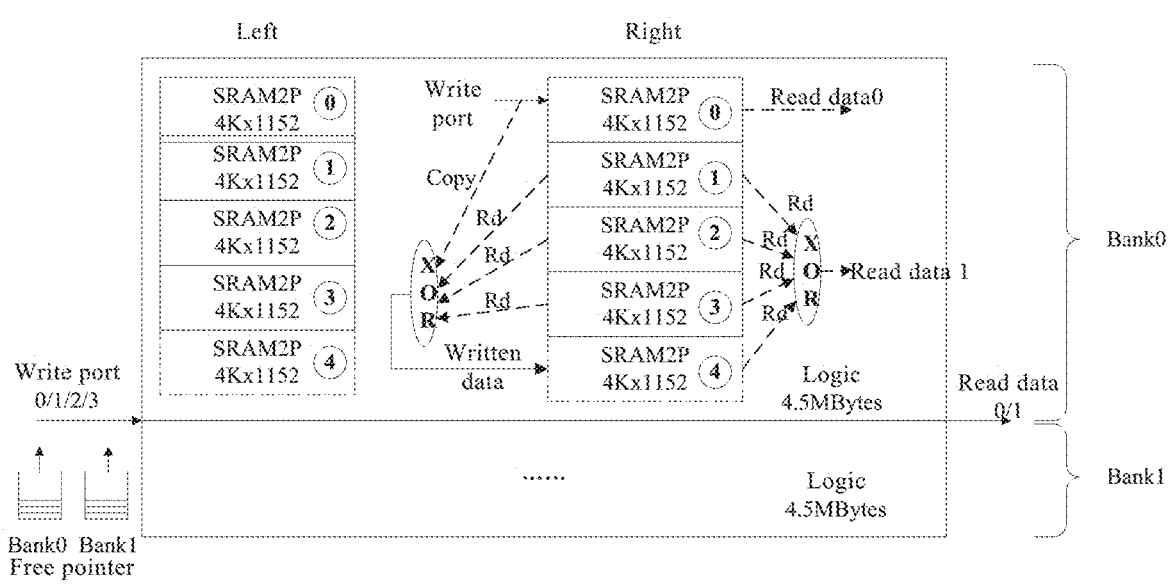
FIG. 13 is a schematic diagram of a packet buffer architecture of two Banks according to a specific embodiment of the present invention.

As shown in FIG. 13, for the 2-read n-write multi-port memory unit of the present invention, the following example will be continued for convenience of description. The value of n is 4 for description in detail. In the example, two 16384-depth and 1152-width 2R1W SRAMs are assembled in parallel into one Bank. The capacity of one Bank is 4.5 M bytes, and a total of 2 banks form a 2R4 W multi-port memory unit of 9M bytes.

In the example, in the process of writing the data into the 2-read n-write multi-port memory unit, simultaneous writing of 4 slices is required to be supported. It is assumed that the data bus bit width of each slice is 1152 bits, and each slice supports the line rate forwarding of 6 100GE ports. In the worst case on a data channel, for the packet data less than or equal to the length of 144 bytes, the core clock frequency needs to run at 892.9 MHz. For the packets larger than the length of 144 bytes, the core clock frequency is required to run at 909.1 MHz.

In one clock cycle, if the bit width of the written data is less than or equal to 144 bytes, simultaneous writing of four slices should be met so that the bandwidth requirement can be satisfied. Thus, the written data of the two slices are written into the two 2R1W memories of one Bank respectively. The written data of the other two slices are written into the two 2R1W memories of the other remaining bank respectively, so that the written data are not collided.

In one clock cycle, if the bit width of the written data is greater than 144 bytes, meanwhile, simultaneous writing of four slices should be met so that the bandwidth requirement can be satisfied. That is, the data of each slice needs to occupy the entire Bank. Thus, for each Slice, the requirement can be met by only adopting the ping-pong operation in two clock cycles. For example, in one clock cycle, two pieces of data therein are written into two Banks. When the second cycle comes, the other two pieces of data are respectively written into two Banks. The two 2R1W memories in each Bank respectively correspondingly store the high and low bits of any data larger than 144 bytes, which is not elaborated here. Thus, there are no conflicts between the written data.

The reading process is similar to the writing process. In the example, only the reading of two pieces of data are supported in each clock cycle.

In one clock cycle, if the bit width of the read data is less than or equal to 144 bytes, in the worst case, the read data is stored in the same 2R1W memory of the same Bank. Since each 2R1W memory of the present invention can simultaneously support two reading requests, the data can be read directly from the specified port regardless of the circumstances.

In one clock cycle, if the bit width of the read data is greater than 144 bytes, in the worst case, the read data is stored in the same Bank, similar to the writing process. The reading request can be met by only adopting the ping-pang operation in two clock cycles, which is not repeated in detail herein.

Figure 14:
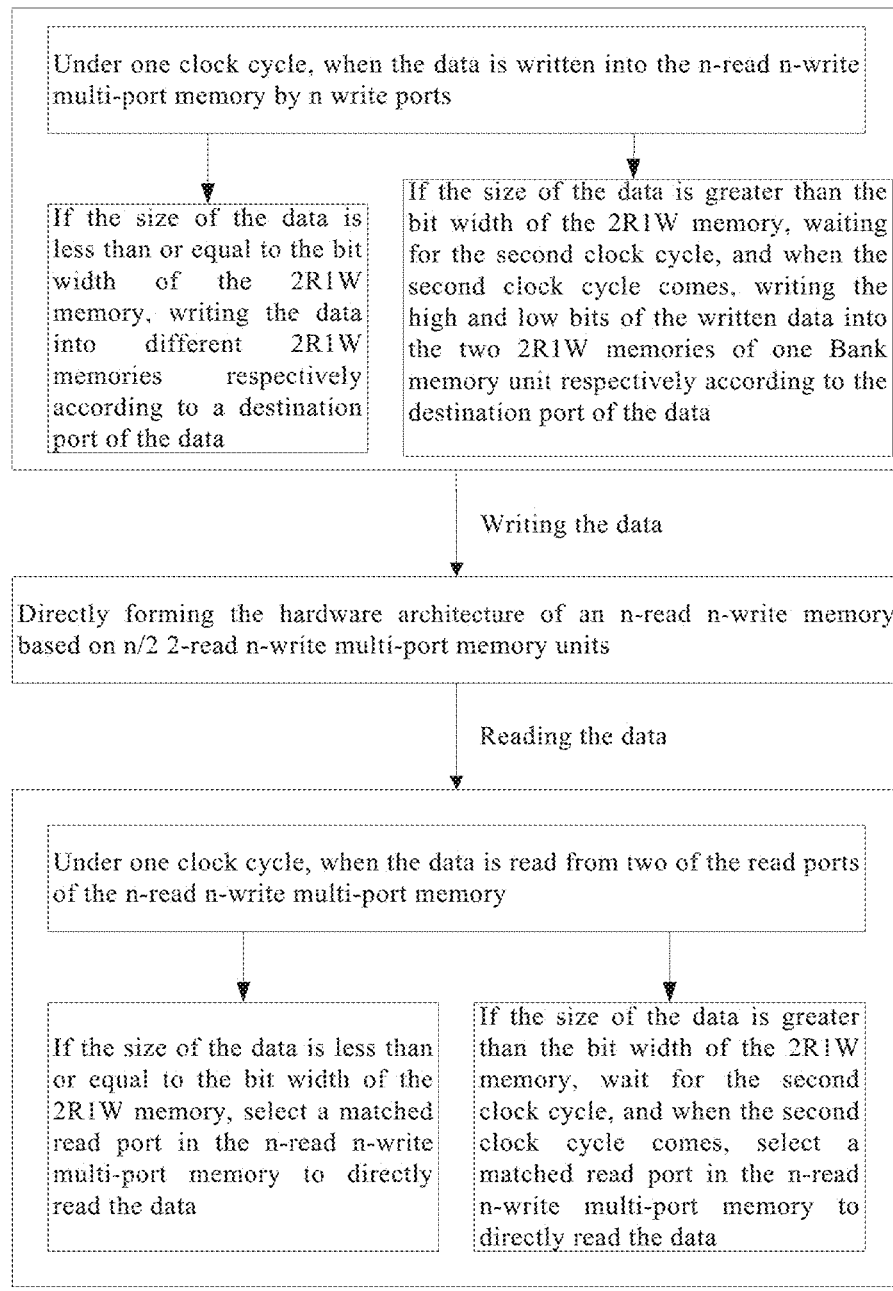
FIG. 14 is a schematic flowchart of a data processing method for an n-read n-write scalable multi-port memory according to an embodiment of the present invention.

Further, FIG. 14 shows the hardware architecture of an n-read n-write memory constructed based on the above 2-read n-write memory unit in a preferred embodiment of the present invention.

In a specific embodiment of the present invention, the method comprises: directly forming the hardware architecture of an n-read n-write memory based on n/2 2-read n-write multi-port memory units; under one clock cycle, when the data is written into the n-read n-write multi-port memory by n write ports, if the size of the data is less than or equal to the bit width of the 2R1W memory, writing the data into different 2R1W memories respectively according to a destination port of the data; and if the size of the data is greater than the bit width of the 2R1W memory, waiting for the second clock cycle, and when the second clock cycle comes, writing the high and low bits of the written data into the two 2R1W memories of one Bank memory unit respectively according to the destination port of the data.

Under one clock cycle, when the data is read from two of the read ports of the n-read n-write multi-port memory, if the size of the data is less than or equal to the bit width of the 2R1W memory, a matched read port in the n-read n-write multi-port memory is selected to directly read the data.

If the size of the data is greater than the bit width of the 2R1W memory, wait for the second clock cycle, and when the second clock cycle comes, a matched read port in the n-read n-write multi-port memory is selected to directly read the data.

The data writing and reading process of the n-read n-write multi-port memory is similar to the writing and reading process of the 2-read n-write multi-port memory unit. The only difference is that in the process of data writing, the writing position needs to be matched according to the forwarding port of the written data, which is not repeated in detail.

Figure 15A:
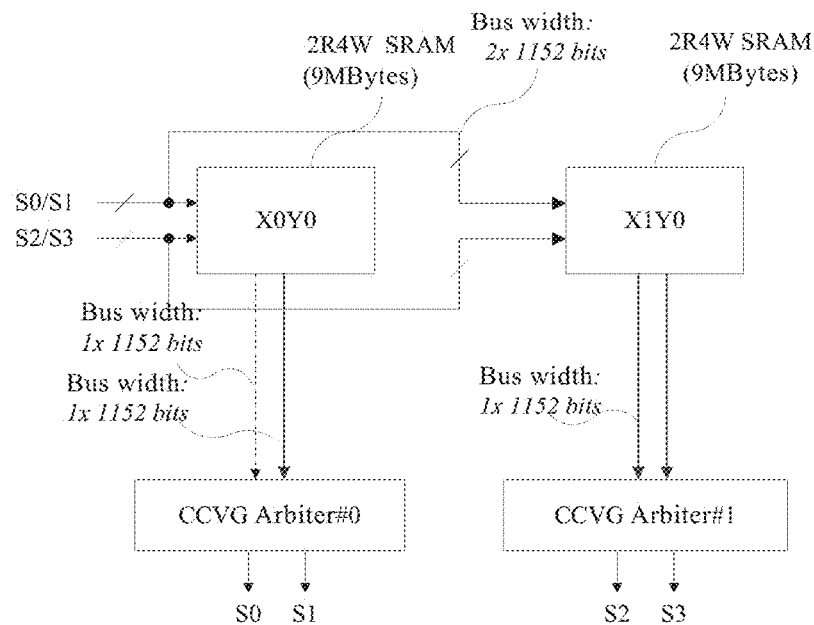
FIG. 15A is a schematic diagram of a packet buffer architecture of a 4R4 W memory according to a specific embodiment of the present invention.

As shown in FIG. 15A, in a specific example of the present invention, the value of n is 4, and in the specific example, the structures of X0Y0 and X1Y1 are the same as those shown in FIG. 13. In the data writing and reading process, storage needs to be performed according to the corresponding forwarding ports. For example, the data of S0 and S1 can only be written into the X0Y0, and the data of S2 and S3 can only be written into the X1Y1. The writing process is not specifically repeated in detail.

Figure 15B:
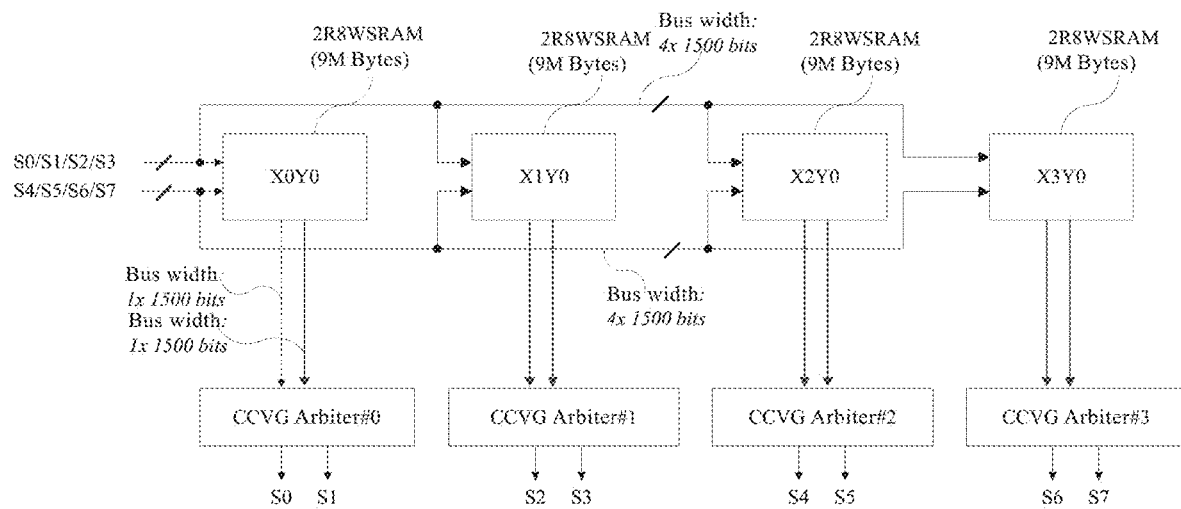
FIG. 15B is a schematic diagram of a packet buffer architecture of an 8R8 W memory according to a specific embodiment of the present invention.

As shown in FIG. 15B, in a specific example of the present invention, the value of n is 8. In the specific example, the structures of the X0Y0, X1Y1, X2Y2, and X3Y3 are similar to those shown in FIG. 13, and the difference is that based on the structure shown in FIG. 13, two more Banks are added to form the 2R8 W memory. In the process of data writing and reading, storage needs to be performed according to the corresponding forwarding ports. For example, the data of S0 and S1 can only be written into the X0Y0, the data of S2 and S3 can only be written into the X1Y1, the data of S4 and S5 can only be written into the X2Y2, the data of S6 and S7 can only be written into the X3Y3, and the writing process is not specifically repeated in detail.

Figures 16, 17:
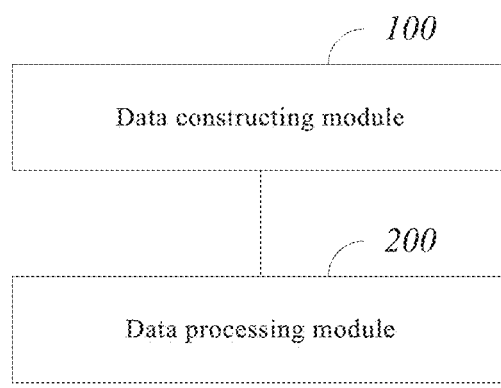
FIG. 16 is a schematic diagram of a comparison relationship between a 2-read n-write memory and the number of CCEs when memory ports are expanded based on the 2-read n-write memory according to a specific embodiment of the present invention.
FIG. 17 is a module schematic diagram of a data processing system for an expandable multi-port memory provided by an embodiment of the present invention.

As shown in FIG. 16, in the present embodiment, when it is necessary to expand the ports of the memory, the hardware architecture of the n-read n-write memory can be realized based on only n/2 2-read n-write multi-port memory units. Compared with the traditional method of expanding the ports of the memory based on the 2R2 W memory, it is convenient to implement the expansion of more Slices.

In addition, the 4R4 W memory and the 14 nm integrated circuit technology are taken as an example for explanation. The 4R4 W memory obtained by the present invention logically requires a total of 40 4096-depth 1152-width SRAM2Ps. The total occupation area is 22.115 square centimeters, and the total power consumption is 13.503 Watts (the technological conditions are the fastest when a core voltage is equal to 0.9V and a junction temperature is equal to 125 DEG C.). Meanwhile, complex control logics are not required. The operation of multiple read ports can be realized only by the simple XOR operation. In addition, the additional memory block mapping table and the control logics are not required.

FIG. 17 shows a data processing system for a scalable multi-port memory provided by an embodiment of the present invention. In the present embodiment, the multi-port memory is a 2-read n-write multi-port memory unit, and n is an even number.

The system comprises: a data constructing module 100 and a data processing module 200.

The data constructing module 100 is specifically configured to assemble two 2R1W memories in parallel into one Bank memory unit; and assemble n/2 Bank memory units in depth into a hardware architecture of one 2-read n-write multi-port memory unit.

The data processing module 200 is specifically configured to, when determining that under one clock cycle, data is written into the 2-read n-write multi-port memory unit by n write ports, if the size of the data is less than or equal to the bit width of the 2R1W memory, write the data into different 2R1W memories respectively; and if the size of the data is greater than the bit width of the 2R1W memory, wait for a second clock cycle, and when the second clock cycle comes, write the high and low bits of the written data into the two 2R1W memories of one Bank memory unit respectively.

The data processing module 200 is further configured to: when determining that under one clock cycle, the data is read from two read ports of the 2-read n-write multi-port memory unit, if the size of the data is less than or equal to the bit width of the 2R1W memory, select a matched read port in the 2-read n-write multi-port memory unit to directly read the data; and if the size of the data is greater than the bit width of the 2R1W memory, wait for the second clock cycle, and when the second clock cycle comes, select a matched read port in the 2-read n-write multi-port memory unit to directly read the data.

In the preferred embodiment of the present invention, the data constructing module 100 adopts five methods to establish the 2R1W memory.

As shown in FIG. 7, in the first embodiment, on the basis of the 6T SRAM, the data constructing module 100 divides a word line into a left one and a right one, so that two read ports can be made for simultaneous operation or one write port is made. In this way, the reading of the data from a left MOS transistor and the reading of the data from a right MOS transistor can be simultaneously performed. It should be noted that the data read by the right MOS transistor cannot be used till being inverted. In order not to affect the speed of data reading, a pseudo-differential amplifier is required as the reading sense amplifier. Thus, the area of the 6T SRAM is unchanged, and the only cost is to double the word line, thereby ensuring that the overall memory density is basically unchanged.

As shown in FIG. 8, in the second embodiment, by customized design, the data constructing module 100 increases the ports of the SRAM, and one word line is cut into two word lines, to increase to two read ports. The technique of time-sharing operation may also be adopted, that is, the read operation is performed on the rising edge of a clock, and the write operation is performed on the falling edge of the clock. In this way, a basic 1-read or 1-write SRAM can be expanded to the 1-read and 1-write SRAM type, that is, one read operation and one write operation can be performed simultaneously, and the memory density is basically unchanged.

As shown in FIG. 9, in the third embodiment, the 2R1W SRAM constructed based on the SRAM2P is taken as an example. The SRAM2P is an SRAM capable of supporting 1-read and 1-read/write, that is, two read operations can be simultaneously performed or one read operation and one write operation can be performed on the SRAM2P.

In the present embodiment, the data constructing module 100 constructs the 2R1W SRAM on the basis of the SRAM2P by copying one SRAM. In this example, the SRAM2P_1 on the right is a copy of the SRAM2P_0 on the left. When in the specific operation, the two SRAM2Ps are used as 1-read and 1-write memories for use. When data is written, the data is written to the left and right SRAM2Ps at the same time. When the data is read, data A is fixedly read from the SRAM2P_0, and the data B is fixedly read from the SRAM2P_1, so that one write operation and two read operations can be performed concurrently.

As shown in FIG. 10a and FIG. 10b, in the fourth embodiment, the data constructing module 100 divides a logically integral 16384-depth SRAM into logically four 4096-depth SRAM2Ps, which are numbered sequentially as 0, 1, 2, and 3. An additional 4096-depth SRAM is arranged, is numbered as 4, and is used as a solution to read-write conflicts. For reading the data A and the data B, it is always ensured that the two read operations can be performed concurrently. When the addresses of the two read operations are in different SRAM2Ps, since any one SRAM2P can be configured as the 1R1W type, there are no read-write conflicts. When the addresses of two read operations are in the same SRAM2P block, for example, both in the SRAM2P_0, since the same SRAM2P can only provide 2 ports for simultaneous operation at most, at this point, the ports are occupied by the two read operations. If one write operation is just to be written into the SRAM2P_0, then such data is written into the fourth SRAM2P_4 block of the memory.

In the present embodiment, a memory block mapping table is required to record which memory block stores valid data. As shown in FIG. 10b, the depth of the memory block mapping table is the same as the depth of one memory block, that is, a 4096 depth. In each entry, the numbers from 0 to 4 of all memory blocks are sequentially stored after initialization. In the example of FIG. 10a, since the SRAM2P_0 has the read-write conflicts when the data is written, the data is actually written to the SRAM2P_4. At this point, the read operation also reads the corresponding content in the memory mapping table, and the original content is {0, 1, 2, 3, 4}, which becomes {4, 1, 2, 3, 0} after modification. The first block number and the fourth block number are exchanged, indicating that the data is actually written to the SRAM2P_4, and the SRAM2P_0 becomes a backup entry.

When the data is read, it is necessary to firstly read the memory block number mapping table of the corresponding address, to check which memory block the valid data is stored in. For example, if the data of the address 5123 is to be read, the content stored in the address 1027 (5123−4096=1027) of the memory block number mapping table is firstly read. The content of the address 1027 of the corresponding storage block is read according to the number of the second column.

For the data writing operation, the memory block number mapping table is required to provide one read port and one write port. For two data reading operations, the memory block number mapping table is required to provide two read ports, so that the memory block number mapping table is required to provide three read ports and one write port in total, and these 4 access operations must be performed simultaneously.

FIG. 11 shows a fifth embodiment. In a preferred embodiment of the present invention, the data constructing module 100, according to the depth and width of the 2R1W memory, selects 2m+1 SRAM2P memories having the same depth and width to construct a hardware architecture of the 2R1W memory, m being a positive integer.

Multiple SRAM2P memories are sequentially SRAM2P(0), SRAM2P(1) . . . SRAM2P(2m) according to an arrangement sequence. Each SRAM2P memory has M pointer addresses, one of the multiple SRAM2P memories is a secondary memory, and the rest SRAM2P memories are main memories.

The product of the depth and width of each SRAM 2P memory is equal to (the product of the depth and width of the 2R1W memory)/2m.

For the convenience of description, the SRAM memory which has the m value of 2 and is the 16384-depth 128-width 2R1W memory is described in detail below.

In this specific example, the multiple SRAM2P memories are sequentially SRAM2P(0), SRAM2P(1), SRAM2P(2), SRAM2P(3) and SRAM2P(4) according to the arrangement sequence, wherein the SRAM2P(0), SRAM2P(1), SRAM2P(2) and SRAM2P(3) are the main memories, and the SRAM2P(4) is the secondary memory. The depth and width of each SRAM2P memory are 4096 and 128 respectively. Correspondingly, each SRAM2P memory has 4096 pointer addresses. If the pointer address of each SRAM2P memory is independently identified, the pointer address of each SRAM2P memory is 0-4095. If the addresses of all the main memories are arranged in order, the range of all the pointer addresses is 0-16383. In this example, the SRAM2P(4) is used to resolve port conflicts. In the present embodiment, the requirement can be met without adding the memory block number mapping table.

Further, based on the above hardware architecture, when the data is written into and/or read from the 2R1W memory, the data processing module 200 is specifically configured to associate the data in the main memories and the data in the secondary memory according to a current pointer position of the data, and performing XOR operation thereon to complete the writing and reading of the data.

In the preferred embodiment of the invention, the data writing process is as follows.

The writing address of the current data is obtained as W(x, y). x represents the arrangement position of the SRAM2P memory where the written data is located, and 0≤x<2m. y represents the specific pointer address in the SRAM2P memory where the written data is located, and 0≤y≤M.

The data in the rest main memories which have the same pointer address as the writing address are obtained and are subjected to the XOR operation with the current written data at the same time. The result of the XOR operation is written into the same pointer address of the secondary memory.

Further, in the preferred embodiment of the present invention, the data reading process of the data processing module 200 is as follows.

If the reading addresses of the current two pieces of read data are in the same SRAM2P memory, then the data processing module 200 is specifically configured to respectively obtain the reading addresses of the two pieces of read data as R1 (x1, y1), R2 (x2, y2). x1 and y1 both represent the arrangement positions of the SRAM2P memory in which the read data are located, 0≤x1<2m, and 0≤x2<2m. y1 and y2 both represent the specific pointer addresses in the SRAM2P memory in which the read data are located, 0≤y1≤M, and 0≤y2≤M.

The data processing module 200 is specifically configured to optionally select the read data stored in one of the reading addresses R1 (x1, y1), and directly read the currently stored data from the currently designated reading address.

The data processing module 200 is specifically configured to obtain the data in the rest main memories and the data stored in the secondary memory, which have the same pointer address as the other reading address, and perform the XOR operation, and output the result of the XOR operation as the stored data of the other reading address.

In one embodiment of the present invention, if the reading addresses of the current two pieces of read data are in different SRAM2P memories, the data processing module 200 directly obtains the data corresponding to the pointer addresses in the different SRAM2P memories for independent output.

It should be noted that if each SRAM2P is further divided logically, for example, if it is divided into 4m SRAM2Ps having the same depth, and then the above 2R1W type SRAM can be constructed by only adding the memory area of ¼m. Correspondingly, the number of physical SRAM blocks is also increased by nearly 2 times, and a lot of area overhead will be occupied in actual locating and wiring. Of course, the present invention is not limited to the above specific embodiments, and other solutions using the XOR operation to expand the memory ports are also included in the protective scope of the present invention, which is not repeated in detail herein.

Further, in a preferred embodiment of the present invention, the data constructing module 100 constructs the hardware architecture of an n-read n-write memory based on the above 2-read n-write multi-port memory unit.

In a specific embodiment of the present invention, the data constructing module 100 directly forms the hardware architecture of the n-read n-write memory based on n/2 2-read n-write multi-port memory units.

The data processing module 200 is further configured to, when determining that under one clock cycle, the data is written into the n-read n-write multi-port memory by n write ports, if the size of the data is less than or equal to the bit width of the 2R1W memory, write the data into different 2R1W memories respectively according to a destination port of the data; and if the size of the data is greater than the bit width of the 2R1W memory, wait for the second clock cycle, and when the second clock cycle comes, write the high and low bits of the written data into the two 2R1W memories of one Bank memory unit respectively according to the destination port of the data.

The data processing module 200 is further configured to, when determining that under one clock cycle, the data is read from two of the read ports of the n-read n-write multi-port memory, if the size of the data is less than or equal to the bit width of the 2R1W memory, select a matched read port in the n-read n-write multi-port memory to directly read the data; and if the size of the data is greater than the bit width of the 2R1W memory, wait for the second clock cycle, and when the second clock cycle comes, select a matched read port in the n-read n-write multi-port memory to directly read the data.

The data writing and reading process of the n-read n-write multi-port memory is similar to the writing and reading process of the 2-read n-write multi-port memory unit. The only difference is that in the process of data writing, the writing position needs to be matched according to the forwarding port of the written data, which is not repeated in detail.

As shown in FIG. 15A, in a specific example of the present invention, the value of n is 4, and in the specific example, the structures of X0Y0 and X1Y1 are the same as those shown in FIG. 13. In the data writing and reading process, storage needs to be performed according to the corresponding forwarding ports. For example, the data of S0 and S1 can only be written into the X0Y0, and the data of S2 and S3 can only be written into the X1Y1. The writing process is not specifically repeated in detail.

As shown in FIG. 15B, in a specific example of the present invention, the value of n is 8. In the specific example, the structures of the X0Y0, X1Y1, X2Y2, and X3Y3 are similar to those shown in FIG. 13, and the difference is that based on the structure shown in FIG. 13, two more Banks are added to form the 2R8 W memory. In the process of data writing and reading, storage needs to be performed according to the corresponding forwarding ports. For example, the data of S0 and S1 can only be written into the X0Y0, the data of S2 and S3 can only be written into the X1Y1, the data of S4 and S5 can only be written into the X2Y2, the data of S6 and S7 can only be written into the X3Y3, and the writing process is not specifically repeated in detail.

As shown in FIG. 16, in the present embodiment, when it is necessary to expand the ports of the memory, the hardware architecture of the n-read n-write memory can be realized based on only n/2 2-read n-write multi-port memory units. Compared with the traditional method of expanding the ports of the memory based on the 2R2 W memory, it is convenient to implement the expansion of more Slices.

In conclusion, according to the data processing method and the data processing system for a scalable multi-port memory according to the present invention, the SRAM of more ports is constructed using algorithms based on existing types of SRAMs, and the multi-port SRAM is supported to the greatest extent by only a minimal cost. In the implementation process, complex control logics and additional multi-port SRAM or register array resources are avoided. By using the uniqueness of the packet buffer and by using spatial division and time division, the packet buffer of multiple ports can be realized by only simple XOR operation. Meanwhile, all buffer resources of the multi-port memory implemented by the present invention can be completely shared between any input ports. Logically, the multi-port memory can be constructed by adopting less CCEs, and the port extension is easy to implement. The present invention has lower power consumption and a faster processing speed and saves more resources or areas. The packet buffer architecture has better scalability, is easy to implement and saves manpower and material costs.

For the convenience of description, the above apparatuses are described with separate modules based on the functions of these modules. Of course, the functions of these modules may be realized in the same or multiple pieces of software and/or hardware when carrying out the present invention.

The apparatus embodiments described above are only illustrative. The modules described as separate members may or may not be physically separated. The members displayed as modules may or may not be physical modules, may be located at the same location and may be distributed in multiple network modules. The objectives of the solutions of these embodiments may be realized by selecting a part or all of these modules according to the actual needs, and may be understood and implemented by those skilled in the art without any inventive effort.

It should be understood that although the description is described according to the embodiments, not every embodiment only includes one independent technical solution, that such a description manner is only for the sake of clarity, that those skilled in the art should take the description as an integral part, and that the technical solutions in the embodiments may be suitably combined to form other embodiments understandable by those skilled in the art.

The above detailed description only specifies feasible embodiments of the present invention, and is not intended to limit the protection scope thereof. All equivalent embodiments or modifications not departing from the spirit of the present invention should be included in the protection scope of the present invention.

What is claimed is:

1. A data processing method for a scalable multi-port memory, wherein the multi-port memory is a 2-read n-write multi-port memory unit, and is an even number:

the method comprises:

assembling two 2R1W memories in parallel into one Bank memory unit;

assembling n/2 Bank memory units in depth into a hardware architecture of one 2-read n-write multi-port memory unit;

under one clock cycle, when data is written into the 2-read n-write multi-port memory unit by n write ports, if the size of the data is less than or equal to the bit width of the 2R1W memory, writing the data into different 2R1W memories respectively; and if the size of the data is greater than the bit width of the 2R1W memory, waiting for a second clock cycle, and when the second clock cycle comes, writing the high and low bits of the written data into the two 2R1W memories of one Bank memory unit respectively.

2. The data processing method for a scalable multi-port memory according to claim 1, wherein the method further comprises:

under one clock cycle, when the data is read from two read ports of the 2-read n-write multi-port memory unit, if the size of the data is less than or equal to the bit width of the 2R1W memory, selecting a matched read port in the 2-read n-write multi-port memory unit to directly read the data; and if the size of the data is greater than the bit width of the 2R1W memory, waiting for the second clock cycle, and when the second clock cycle comes, selecting a matched read port in the 2-read n-write multi-port memory unit to directly read the data.

3. The data processing method for a scalable multi-port memory according to claim 2, wherein the method further comprises:

according to the depth and width of the 2R1W memory, selecting $2m+1$ SRAM1P memories having the same depth and width to construct a hardware architecture of the 2R1W memory, in being a positive integer, wherein each SRAM2P memory has M pointer addresses, one of the plurality of SRAM2P memories is a secondary memory, and the rest SRAM2P memories are main memories; and when the data is written into and/or read from the 2R1W memory, associating the data in the main memories and the data in the secondary memory according to a current pointer position of the data, and performing XOR operation thereon to complete the writing and reading of the data.

4. The data processing method for a sealable multi port memory according to claim 2, wherein the method further comprises:

directly forming the hardware architecture of an n-read n-write memory based on n/2 2-read n-write multi-port memory units;

under one clock cycle, when the data is written into the n-read n-write multi-port memory by n write ports, if the size of the data is less than or equal to the bit width of the 2R1W memory, writing the data into different 2R1W memories respectively according to a destination port of the data; and if the size of the data is greater than the bit width of the 2R1W memory, waiting for the second clock cycle, and when the second clock cycle comes, writing the high and low bits of the written data into the two 2R1W memories of one Bank memory unit respectively according to the destination port of the data.

5. The data processing method for a scalable multi-port memory according to claim 4, wherein the method further comprises:

under one clock cycle, when the data is read from two of the read ports of the 1-read n-write multi-port memory, if the size of the data is less than or equal to the bit width of the 2R1W memory, selecting a matched, read port in the n-read n-write multi-port memory to directly read the data; and if the size of the data is greater than the bit width of the 2R1W memory, waiting for the second clock cycle, and when the second clock cycle comes, selecting a matched read port in the n-read n-write multi-port memory to directly read the data.

6. The data processing method for a scalable multi-port memory according to claim 4, wherein the method further comprises:

according to the depth and width of the 2R1W memory, selecting $2m+1$ SRAM2P memories having the same depth and width to construct a hardware architecture of the 2R1W memory, m being a positive integer, wherein each SRAM2P memory has M pointer addresses, one of the plurality of SRAM2P memories is a secondary memory, and the rest $SRAM21^3$ memories are main memories; and when the data is written into and/or read from the 2R1W memory, associating the data in the main memories and the data in the secondary memory according to a current pointer position of the data, and performing XOR operation thereon to complete the writing and reading of the data.

7. The data processing method for a scalable multi-port memory according to claim 5, wherein, the method further comprises:

according to the depth and width of the 2R1W memory, selecting $2m+1$ SRAM21 memories having the same depth and width to construct a hardware architecture of the 2R1W memory, m being a positive integer, wherein each SRAM2P memory has M pointer addresses, one of the plurality of SRAM2P memories is a secondary memory, and the rest SRAM2P memories are main memories; and when the data is written into and/or read from the 2R1W memory, associating the data in the main memories and the data in the secondary memory according to a current pointer position of the data, and performing XOR operation thereon to complete the writing and reading of the data.

8. The data processing method for a scalable multi-port memory according to claim 1, wherein the method further comprises:

according to the depth and width of the 2R1W memory, selecting $2m+1$ SRAM2P memories having the same depth and width to construct a hardware architecture of the 2R1W memory, m being a positive integer, wherein each SRAM2P memory has M pointer addresses, one of the plurality of SRAM2P memories is a secondary memory, and the rest SRAM2P memories are main memories; and when the data is written into and/or read from the 2R1W memory, associating the data in the main memories and the data in the secondary memory according to a current pointer position of the data, and performing XOR operation thereon to complete the writing and reading of the data.

9. A data processing system for a scalable multi-port memory, wherein the multi-port memory is a 2-read n-write multi-port memory unit, and n is an even number;
the system comprises: a data constructing module and a data processing module;
the data constructing module is configured to assemble two 2R1W memories in parallel into one Bank memory unit; and
assemble n/2 Bank memory units in depth into a hardware architecture of one 2-read n-write multi-port memory unit;
the data processing module is configured to, when determining that under one clock cycle, data is written into the 2-read n-write multi-port memory unit by n write ports,
if the size of the data is less than or equal to the bit width of the 2R1W memory, write the data into different 2R1W memories respectively; and
if the size of the data is greater than the bit width of the 2R1W memory, wait for a second clock cycle, and when the second clock cycle comes, write the high and low bits of the written data into the two 2R1W memories of one Bank memory unit respectively.

10. The data processing system for a scalable multi-port memory according to claim 9, wherein the data processing module is further configured to:
when determining that under one clock cycle, the data is read from two read ports of the 2-read n-write multi-port memory unit,
if the size of the data is less than or equal to the bit width of the 2R1W memory, select a matched read port in the 2-read n-write multi-port memory unit to directly read the data; and
if the size of the data is greater than the bit width of the 2R1W memory, wait for the second clock cycle, and when the second clock cycle comes, select a matched read port in the 2-read n-write multi-port memory unit to directly read the data.

11. The data processing system for a scalable multi-port memory according to claim 10, wherein
the data constructing module is further configured to:
according to the depth and width of the 2R1W memory, select 2m+1 SRAM2P memories having the same depth and width to construct a hardware architecture of the 2R1W memory, m being a positive integer, wherein
each SRAM2P memory has M pointer addresses, one of the plurality of SRAM2P memories is a secondary memory, and the rest SRAM2P memories are main memories; and
when the data is written into and/or read from the 2R1W memory, the data processing module is further configured to, according to a current pointer position of the data, associate the data in the main memories, and the data in the secondary memory, and perform XOR operation thereon to complete the writing and reading of the data.

12. The data processing system for a scalable multi-port memory according to claim 10, wherein
the data constructing module is further configured to:
directly form the hardware architecture of an n-read n-write memory based on n/2 2-read n-write multi-port memory units; and
the data processing module is further configured to, when determining that under one clock cycle, the data is written into the n-read n-write multi-port memory by n write ports,
if the size of the data is less than or equal to the bit width of the 2R1W memory, write the data into different 2R1W memories respectively according to a destination port of the data; and
if the size of the data is greater than the bit width of the 2R1W memory wait for the second clock cycle, and when the second clock cycle comes, write the high and low bits of the written data into the two 2R1W memories of one Bank memory unit respectively according to the destination port of the data.

13. The data processing system for a scalable multi-port memory according to claim 12, wherein
the data processing module is further configured to:
when determining that under one clock cycle, the data is read from two of the read ports of the n-read n-write multi-port memory,
if the size of the data is less than or equal to the bit width of the 2R1W memory, select a matched read port in the n-read n-write multi-port memory to directly read the data; and
if the size of the data is greater than the bit width of the 2R1W memory, wait for the second clock cycle, and when the second clock cycle comes, select a matched read port in the n-read n-write multi-port memory to directly read the data.

14. The data processing system for a scalable multi-port memory according to claim 13, wherein
the data constructing module is further configured to according to the depth and width of the 2R1W memory, select 2m+1 SRAM2P memories having the same depth and width to construct a hardware architecture of the 2R1W memory, m being a positive integer, wherein
each SRAM2P memory has M pointer addresses, one of the plurality of SRAM2P memories is a secondary memory, and the rest SRAM2P memories are main memories; and
when the data is written into and/or read from the 2R1W memory, the data processing module is further configured to, according to a current pointer position of the data, associate the data in the main memories and the data in the secondary memory, and perform XOR operation thereon to complete the writing and reading of the data.

15. The data processing system for a scalable multi-port memory according to claim 12, wherein
the data constructing module is further configured to:
according to the depth and width of the 2R1W memory, select 2m+1 SRAM2P memories having the same depth and width to construct a hardware architecture of the 2R1W memory, m being a positive integer, wherein
each SRAM2P memory has M pointer addresses, one of the plurality of SRAM2P memories is a secondary memory, and the rest SRAM2P memories are main memories; and
when the data is written into and/or read from the 2R1 memory, the data processing module is further configured to, according to a current pointer position of the data, associate the data in the main memories and the data in the secondary memory, and perform XOR operation thereon to complete the writing and reading of the data.

16. The data processing system for a scalable multi-port memory according to claim 9, wherein
the data constructing module is further configured to:
according, to the depth and width of the 2R1W memory, select 2m+1 SRAM2P memories having the same depth and width to construct a hardware architecture of the 2R1W memory, m being a positive integer, wherein each SRAM2P memory has M pointer addresses, one of the plurality of SRAM2P memories is a secondary memory, and the rest SRAM2P memories are main memories; and when the data is written into and/or read from the 2R1W memory, the data processing module is further configured to, according to a current pointer position of the data, associate the data in the main memories and the data in the secondary memory, and perform XOR operation thereon to complete the writing and reading of the data.

* * * * *